US006214719B1

(12) United States Patent
Nag

(10) Patent No.: US 6,214,719 B1
(45) Date of Patent: Apr. 10, 2001

(54) METHOD OF IMPLEMENTING AIR-GAP TECHNOLOGY FOR LOW CAPACITANCE ILD IN THE DAMASCENE SCHEME

(75) Inventor: Somnath Nag, Saratoga, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 09/408,631

(22) Filed: Sep. 30, 1999

(51) Int. Cl.[7] .............................. H01L 21/76; H01L 21/44
(52) U.S. Cl. ..................... 438/619; 438/421; 438/422; 438/622; 438/623; 438/624
(58) Field of Search ........................... 438/619, 622–624, 438/421, 422; 257/758–760

(56) References Cited

U.S. PATENT DOCUMENTS

| 5,736,446 | 4/1998 | Wu | 438/305 |
| 5,883,009 | 3/1999 | Villa et al. | 438/739 |
| 5,891,783 | 4/1999 | Lin et al. | 438/302 |
| 5,914,519 | 6/1999 | Chou et al. | 257/410 |
| 6,093,633 | * 7/2000 | Matsumoto | 438/622 |

OTHER PUBLICATIONS

B. Shieh, K. C. Saraswat, J. P. McVittie, S. List, S. Nag, M. Islamraja, and R. H. Havemann, Air–Gap Formation During IMD Deposition to Lower Interconnect Capacitance; IEEE Electron Device Letters, vol. 19, No. 1., Jan. 1998, pp. 16–18.

B.P. Shieh, L.C. Bassman, D.K. Kim, K.C. Saraswat, M.D. Deal, J.P. McVittie, R.S. List, S. Nag, and L. Ting, Integration and Reliability Issues for Low Capacitance Air–Gap Interconnect Structures, 1998 IEEE, pp. 125–127.

S. V. Nguyen, High–Density Plasma Chemical Vapor Deposition of Silicon–Based Dielectric Films for Integrated Circuits, IBM Journal of Research & Development, vol. 43, No. 1/2–Plasma processing, 16 pages, No Date.

Ben Shieh, Krishna Saraswat, Mike Deal, Jim McVittie, Stanford University, Stanford, California; Air Gaps Lower k of Interconnect Dielectrics, Solid State Technology, Feb. 1999, pp. 51, 52, 54, 57, 58.

* cited by examiner

Primary Examiner—John F. Niebling
Assistant Examiner—Ha Tran Nguyen
(74) Attorney, Agent, or Firm—DeLio & Peterson, LLC; Robert Curcio

(57) ABSTRACT

Air-gap technology is introduced in the damascene scheme, reducing the capacitance between interconnect metal lines on an integrated circuit substrate, and ultimately enhancing the speed of the device. Reduction of extraneous signal energy (cross-talk) from traversing from one metal line to another is also realized. The method for implementing an air-gap filled dielectric between the interconnect metal lines involves depositing a first dielectric layer on the substrate at a predetermined height. Next the first dielectric is patterned and etched to form lines. A second dielectric layer is then deposited using air-gap technology, such that the second dielectric contains air-gaps between the first dielectric lines. These air-gaps are situated below the predetermined height of the first dielectric. The substrate is then polished so that the top surface of the first dielectric is exposed. The first dielectric lines are then etched and removed. A metal is deposited in place of the removed first dielectric lines, forming interconnect metal lines on the substrate having an air-gap filled dielectric therebetween. The air-gap filled dielectric has a dielectric constant on the order of k=1.9 to 2.5, which is significantly lower than that of the same dielectric material without the air-gap.

27 Claims, 2 Drawing Sheets

METHOD OF IMPLEMENTING AIR-GAP TECHNOLOGY FOR LOW CAPACITANCE ILD IN THE DAMASCENE SCHEME

BACKGROUND OF THE INVENTION

1. Field of the Invention

The present invention, in general, relates to a semiconductor process, and more specifically, to a method of implementing air-gap technology in a semiconductor device so as to reduce parasitic capacitance between metal lines, improve the integrated circuit chip speed, and reduce power consumption and cross-talk.

2. Description of Related Art

As device dimensions continue to shrink, the parasitic effects of line to line capacitance becomes a critical factor to performance and circuit integrity. The RC delays associated with the interconnect metal lines of a semiconductor device have become a limiting factor to the speed of the device. Intra-level line-to-line capacitance increasingly dominates over inter-level capacitance, adding significant delay to the rise and fall times of the propagating signals. Reducing the capacitance between the interconnect metal lines on an integrated circuit chip will enhance the speed of the device and reduce extraneous signal energy (cross-talk) from traversing from one metal line to another.

Prior art attempts to reduce the RC delays have focused on utilizing material with a low dielectric constant to fill the gaps between the interconnect metal lines. A low dielectric constant reduces the capacitance associated with a given material. Silicon oxide ($SiO_2$), which is typically placed between the metal lines, has a dielectric constant (k) of about 4.0–4.1.

Electrical current through the metal lines charges the insulating dielectric material between the lines. The time to charge is proportional to the dielectric constant of the material. Greater capacitance of the interconnecting material, i.e., a greater dielectric constant, will delay the rise and fall times of signals in the metal lines, thereby adversely affecting the chip speed.

It has been estimated that the RC interconnection delay could be reduced if the silicon oxide films, with a dielectric constant of approximately 4.0, could be replaced by films having a lower dielectric constant. Current low k dielectrics under investigation include fluorinated $SiO_2$, aerogels, and polymers.

Polymers with dielectric constants on the order of k=2.5 have been used as the interconnecting material, but these materials are unstable under thermal treatment and throughout the chip fabrication process.

Another approach, leading to a reduction of the dielectric constant to about 3.3–3.8, involves the incorporation of bounded fluorine in silicon oxide films deposited by plasma chemical vapor deposition (PCVD) to form a fluorinated oxide. However, fluorine is also not stable and will degrade the metal lines that are in contact with it.

Porous materials have also been used between the interconnect metal lines. These materials, commonly referred to as aerogels, will yield dielectric constants on the order of k=1.9 to 2.0. However, they are extremely unstable during the fabrication process and are susceptible to shrinkage. These materials are also known to cause deleterious effects during chemical-mechanical polishing, a necessary process step in chip fabrication.

Prior art techniques have also included the introduction of air-gaps to reduce the capacitance between adjacent materials in a semiconductor device. U.S. Pat. No. 5,891,783 issued to Lin, et al., on Apr. 6, 1999, entitled "METHOD OF REDUCING FRINGE CAPACITANCE", teaches the introduction of an air-gap formed between a gate and a substrate on a semiconductor device. According to the Lin invention, with the formation of the air-gap, the fringe capacitance between the gate and the substrate is reduced to the lower dielectric constant of air (k=1.0). Thus, the signal delay time is effectively shortened. This air-gap is formed during the removal of a silicon nitride layer. The thickness of the air-gap being the thickness of the removed silicon nitride.

The dielectric constant of air is about 1.0. Compared to the material of a conventional spacer, that is, silicon oxide or silicon nitride, the dielectric constant of air is significantly smaller, so that the capacitance of material having an air-gap therein is significantly reduced. Thus, air bridges in the interconnect metal line gaps would effectively achieve the greatest reduction in dielectric constant. However, mechanical rigidity and device reliability are compromised with air bridges. Also, chip to chip variations in device speed and power consumption are prevalent when air bridge gaps are introduced.

Although B. Shieh, et al., "AIR-GAP FORMATION DURING IMD DEPOSITION TO LOWER INTERCONNECT CAPACITANCE", IEEE Electron Device Letters, Vol. 19, No. 1, January, 1998, pp. 16–18, shows a composite of an air-gap within $SiO_2$ is beneficial in mitigating the adverse affects of a non-composite air-gap bridge and reducing the interconnect capacitance, there is no disclosure or suggestion that such a composite structure could be implemented in a damascene scheme.

Bearing in mind the problems and deficiencies of the prior art, it is therefore an object of the present invention to provide a method for decreasing the dielectric constant of the material between interconnect metal lines of a semiconductor substrate in a damascene scheme.

It is another object of the present invention to provide a method of increasing the speed of an integrated circuit chip in a plasma chemical vapor deposition fabrication process.

A further object of the invention is to provide a method for introducing air-gap technology in an ILD damascene scheme.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, a method for establishing a low dielectric material between metal lines in a damascene scheme, comprising the steps of: a) providing a polished substrate; b) depositing a first dielectric layer on the substrate at a predetermined height and having a top surface; c) patterning and etching the first dielectric layer to form lines; d) depositing a second dielectric layer between the first dielectric layer lines and forming air gaps in the second dielectric layer, the air gaps formed below the predetermined height; e) polishing the substrate until the top surface of the first dielectric layer lines are exposed, while leaving lines of the second dielectric layer therebetween; f) etching and removing the first dielectric layer; and, g) depositing metal at the predetermined height and between the second dielectric layer lines.

Additionally, step (a) may further comprise providing a polished substrate having a pre-metal dielectric layer with vias connected to individual transistor contacts, or a polished substrate with metal lines and vias therein.

Polishing the substrate further comprises applying a chemical-mechanical polishing process. Etching and removing the first dielectric layer may comprise wet etching with hot phosphoric acid. Additionally, depositing metal further comprises depositing a barrier liner and seed layer for metal deposition, and depositing copper metal.

In a second aspect, the present invention relates to a method for implementing low dielectric lines between metal lines in a damascene scheme, comprising the steps of: a) providing a substrate having a substrate top surface; b) polishing the substrate top surface; c) depositing a silicon nitride layer on the substrate top surface; d) forming silicon nitride lines, the nitride lines having exposed top surfaces; e) depositing an oxide layer having an upper surface and forming air gaps therein such that the air gaps are located in the spaces between the nitride lines and below the nitride lines top surfaces; f) polishing the oxide layer and exposing the top surface of the nitride lines; g) removing the nitride lines such that oxide lines having air gaps therein remain on the substrate; h) depositing a metal layer between the oxide lines; and, i) polishing the metal layer to expose the upper surface of the oxide lines.

Step (c) further comprises depositing a silicon nitride layer at a predetermined height. The predetermined height is determined to be equal to or greater than the thickness of metal lines to be later deposited.

Step (d) comprises forming the lines by patterning and etching the nitride layer in accordance with predetermined metal design rules.

Step (g) comprises removing the nitride lines using a wet etch process. The wet etch process may include using a hot phosphoric acid.

Step (h) may further comprise: a) depositing a barrier liner between the oxide lines; and, b) depositing a metal seed layer between the oxide lines.

Additionally, this method may further comprise the steps of: j) depositing a thin film silicon nitride layer; k) depositing a second oxide layer on the thin film silicon nitride layer; l) patterning and etching the oxide layer for placement of vias; and, m) depositing metal for the vias.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with accompanying drawings in which:

DESCRIPTION OF THE PREFERRED EMBODIMENTS(S)

Figure 1A:
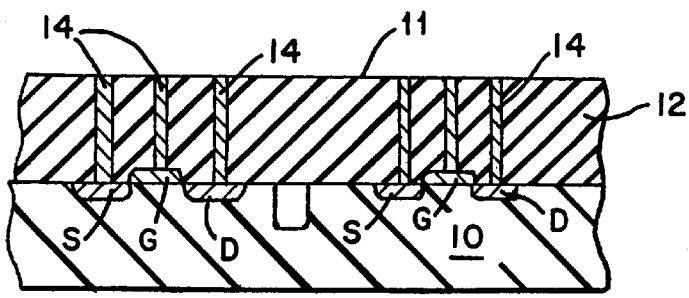
FIG. 1A is a vertical cross-sectional view of a silicon substrate having a pre-metal dielectric layer with vias connected to transistor gates.

In describing the preferred embodiment of the present invention, reference will be made herein to FIGS. 1–8 of the drawings in which like numerals refer to like features of the invention. Features of the invention are not necessarily shown to scale in the drawings.

In order to achieve effective k-values as low as 1.9 to 2.5, a controlled air-gap formation is demonstrated in a subtractive aluminum multilevel interconnect structure. The preferred process implementing this technology in the damascene scheme is described herein.

FIG. 1A depicts the starting substrate 10, which is typically the first level of a damascene structure. The substrate may be composed of several dielectric layers of a multilayer structure (an inter-layer device or ILD). If the substrate is layered, it may have metal connections exposed to provide electrical contact with the next layer to be subsequently configured.

There are two forms for a starting substrate when implementing a process in the damascene scheme (whether introducing air-gaps or otherwise). In FIG. 1A the starting substrate 10 is depicted with a pre-metal dielectric (PMD) 12 as the top layer. This PMD is typically phosphorous silicate glass (psg) or boron psg. The PMD layer incorporates metal plugs in contacts or vias 14 to the source, S, drain, D, and gate, G, of each transistor.

Figure 1B:
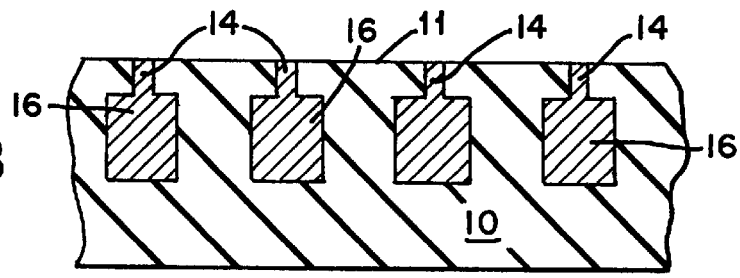
FIG. 1B is a vertical cross-sectional view of a silicon substrate having plugs and vias therein.

In the second form, FIG. 1B depicts starting substrate 10 having metal lines 16 with metal plugs in vias 14 exposed at the top surface 11 for electrical connection to the next layer. Regardless of whether the starting substrate is a layered structure as depicted in FIGS. 1A or 1B, the process steps necessary for implementation of the controlled air-gap) formation in a damascene scheme will remain the same independent of the under-layers existing within the substrate.

The preferred process steps for implementing controlled air-gap technology in a damascene scheme are described herein.

The starting substrate of FIG. 1A is depicted throughout this process, however, either starting substrate form, as shown in FIGS. 1A or 1B, may be used in this process. A starting substrate 10 having top surface 11 with metal plugs in vias 14 making electrical connection to the source, S, drain, D, and gate, G, of a transistor, is used to commence this process. The starting substrate is polished in a chemical-mechanical polishing process, as shown in FIG. 1A. The top surface 11 is polished along with any plugs or vias exposed thereon.

Figure 2:
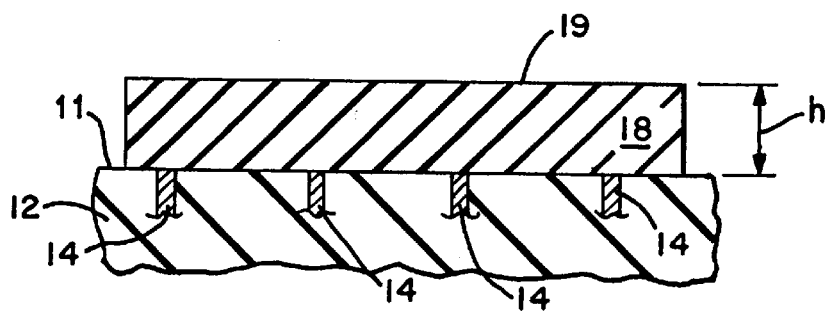
FIG. 2 is a vertical cross-sectional view of the substrate of FIG. 1A with a first dielectric layer applied thereon.

Next, referring to FIG. 2, a first dielectric layer 18 is applied to the polished substrate. The dielectric layer is preferably a silicon nitride film deposited using a plasma chemical vapor deposition process. Importantly, the thickness h of the dielectric film (i.e., the height of the film above the substrate surface 11) is predetermined to be greater than or equal to the thickness or height of the interconnect metal lines which are deposited in the later steps of the process. The thickness or height h of the dielectric film layer is determined as the distance from the substrate top surface 11 to the first dielectric layer top surface 19.

Figure 3:
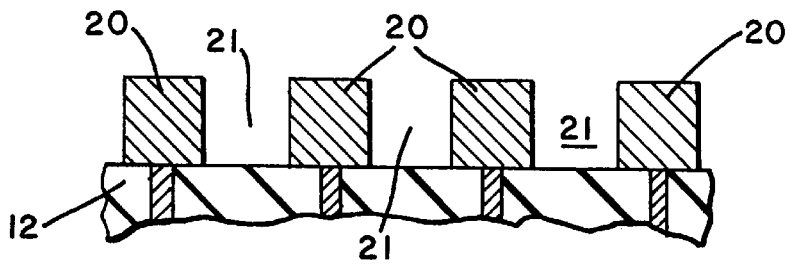
FIG. 3 is a vertical cross-sectional view of the substrate and first dielectric layers of FIG. 2 with a line pattern etched in the first dielectric layer.

The first dielectric layer 18, e.g., a silicon nitride layer, is then patterned and etched into a line-space geometry pursuant to metal design rules. FIG. 3 depicts a vertical cross section of the silicon nitride line segments 20 after etching, having spaces 21 therebetween. The etching may be performed by any of the etch methods for silicon nitride known to one skilled in the art.

Figure 4:
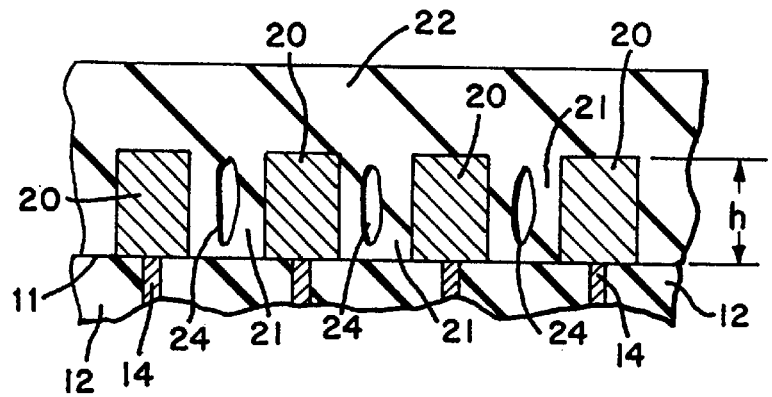
FIG. 4 is a vertical cross-sectional view of the layered, etched substrate of FIG. 3 with a second dielectric layer applied thereon having air-gaps formed between the etched lines of the first dielectric.

Next, a known plasma chemical vapor deposition process for inter-layer device oxide deposition is performed, as depicted in FIG. 4, depositing a second dielectric layer to the structure. Part of the second dielectric layer will fill gaps 21 in between the nitride lines 20. It is estimated that the RC signal delay could be reduced if the silicon oxide films could be replaced by films having a lower dielectric constant. Decreasing the dielectric constant of the second dielectric layer with gaps or voids 24 will ultimately achieve the objective of reducing the RC signal delay and interline capacitance between interconnect metal lines.

The PECVD process requires the use of a relatively low pressure to achieve a high electron density and a high fractional ionization rate. Depending upon the configuration of the plasma reactor and the type of wafer used, many process parameter sequences can be modified during deposition to minimize both electrical and physical damage to the topography and electrical features on the substrate or wafer. Besides parameters associated with the design of the system, the inductive coil and the plasma source, there are several principal process parameters that affect the deposited film properties: substrate temperature, reactant gas ratio, RF biasing power, and deposition pressure. Using these process control parameters, an oxide layer 22 is deposited on and between the nitride lines 20 and within gaps 21.

Established CVD oxide processes have been fine-tuned to produce air-gaps between metal lines to lower the k-value of the interconnect dielectric stacks. For example, in B. Shieh, et al., "AIR GAPS LOWER K OF INTERCONNECT DIELECTRICS," Solid State Technology, February, 1999, pp. 51–58, a method is introduced for producing air-gaps between metal lines during $SiO_2$ deposition. This methodology is incorporated herein by reference. Through this known process, air-gaps 24 are formed in the oxide layer within gaps 21 between the nitride lines 20.

The size and position of the air-gaps is strictly controlled such that they are the same in all the inter-metal spaces of the same dimension. Each air-gap is formed as to not exceed above each nitride line top surface, i.e., the top of the air-gaps stay within a predetermined distance less than h from the substrate top surface 11.

Figure 5:
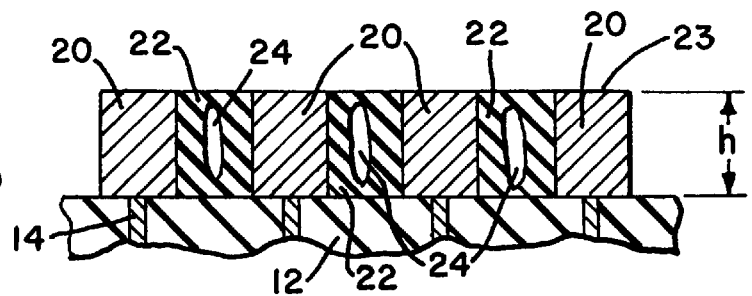
FIG. 5 is a vertical cross-sectional view of the layered substrate of FIG. 4 with the second dielectric layer polished down to the height of the first dielectric layer lines.

Referring to FIG. 5, the deposited oxide layer 22 is next polished until its height is level with the silicon nitride lines' 20 top surface 23. Thus, the polishing reduces the height of the oxide layer 22 until the nitride lines 20 are exposed at height h. The air-gaps 24 formed within the oxide layer are situated between each nitride line 20 and below the multi-lined layer top surface 23. By enclosing each air-gap within the oxide lines, the air-gaps will remain as voids, providing a low dielectric gap-fill between the interconnect metal lines, once these lines are formed.

Figure 6:
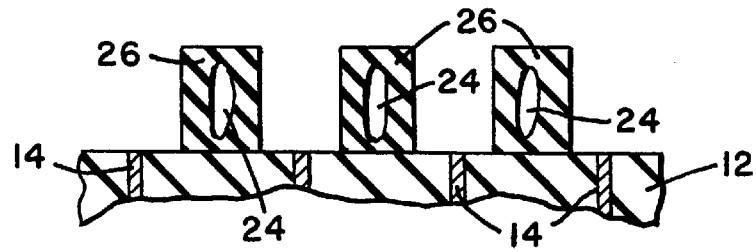
FIG. 6 is a vertical cross-sectional view of the layered substrate of FIG. 5 with the first dielectric layer removed.

Next, the silicon nitride lines 20 are removed, leaving the oxide lines 26 on substrate layer 12, the oxide lines having air-gaps 24 therein, as shown in FIG. 6. The silicon nitride is removed using a wet-etch process, preferably a hot phosphoric acid process, although other etching processes may be substituted without deleterious affect.

Figure 7A:
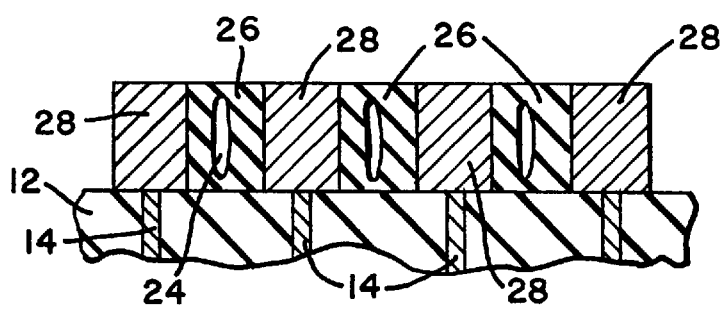
FIG. 7A is a vertical cross-sectional view of the layered substrate of FIG. 6 with metal lines deposited between the second dielectric lines.

Referring to FIG. 7A, a metal is then deposited between the oxide lines 26, forming interconnect metal lines 28. The metal is preferably a copper based alloy, although other metals may be used, such as aluminum, and the like. Depositing the metal requires first depositing a barrier liner and seed layer. Typically a thin layer of Ta and/or TaN is deposited using a known CVD process as the barrier to the copper metal. Then, a thin film of copper is deposited as the seed layer for the subsequent electro-fill of the structure. The copper seed layer, as apparent from its name, provides a favorable thin film upon which nucleation and growth of copper, as the fill material, can be promoted.

The copper metal lines are then polished to expose just the top of the oxide lines containing the embedded air-gaps. The dielectric of the gap-fill region between the interconnect metal lines has been shown to be on the order of k=1.9 to 2.5, significantly lower than the 4.0 dielectric constant of the dielectric material without the air-gaps.

Figure 7B:
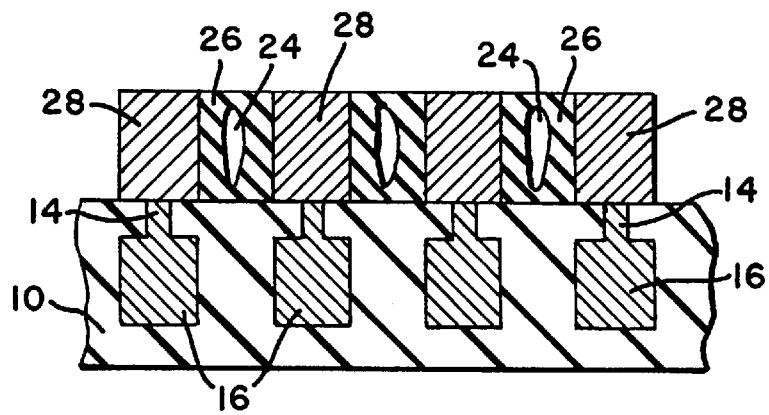
FIG. 7B is a vertical cross-sectional view of the layered substrate of FIG. 6 with plugs and vias in the substrate and metal lines deposited between the second dielectric lines.

If substrate 10 had been previously prepared with plugs 16 and vias 14 as shown in FIG. 1B, the metal interconnect lines of FIG. 7A would have been aligned above them. FIG. 7B depicts the resultant interconnect metal lines with an air-gap dielectric material placed in between each line, where the metal lines are above and electrically in contact with the vias 14 of the lower layer.

Figure 8:
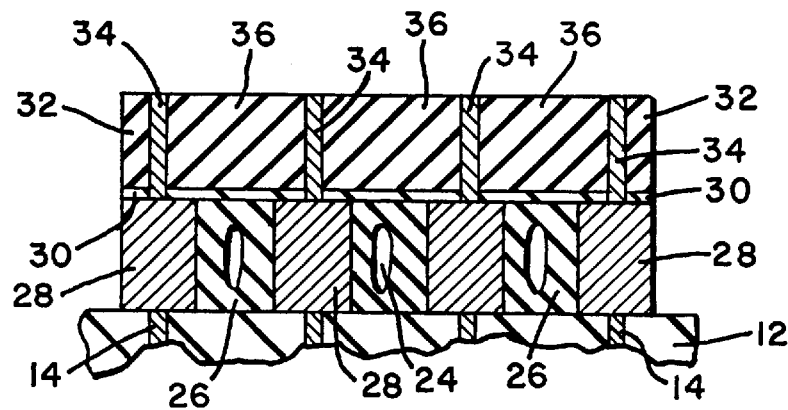
FIG. 8 is a vertical cross-sectional view of the layered substrate of FIG. 7A with a silicon nitride layer and a second oxide layer applied, the second oxide layer having vias for providing electrical connection to the interconnect metal lines.

Furthermore, subsequent to the fabrication of a substrate having metal interconnect lines with air-gap filled oxide lines therebetween, a thin silicon nitride layer 30 may be applied, along with a second oxide layer 32 to the completed substrate of FIGS. 7A or 7B, as shown in FIG. 8. The application of the thin film silicon nitride layer follows the copper polishing step. This silicon nitride layer is preferably on the order of 500 angstroms and serves as a copper diffusion barrier. The second oxide layer 32 may be patterned and etched for placement of additional vias 34. Metal would then fill the gaps etched for the vias, and electrical connection may be made through these vias to additional layers of the substrate. FIG. 8 depicts the additional oxide layer 32 having metal filled vias 34 and gaps 36.

Following the process steps described above and delineated in the representative FIGS. 1–8, a method for introducing an air-gap dielectric in the damascene scheme is presented, yielding a dielectric constant as low as k=1.9 and reducing the parasitic capacitance between each line. The method involves the implementation of air-gap technology within lines, that are situated between previously deposited nitride lines. After polishing and removal of the nitride lines, metal lines fill the spaces between the gap-filled oxide dielectric lines.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for establishing a low dielectric constant material between metal lines in a damascene scheme, comprising the steps of:

a) providing a polished substrate;

b) depositing a first dielectric layer on said substrate at a predetermined height and having a top surface;

c) patterning and etching said first dielectric layer to form lines;

d) depositing a second dielectric layer between the first dielectric layer lines and forming air gaps in said second dielectric layer, said air gaps formed below said predetermined height;

e) polishing said second dielectric layer until the top surface of said first dielectric layer lines are exposed, while leaving lines of said second dielectric layer therebetween;

f) etching and removing said first dielectric layer; and, g) depositing metal at said predetermined height and between said second dielectric layer lines.

2. The method of claim 1 wherein said step (a) comprises providing a polished substrate having a pre-metal dielectric layer with vias connected to individual transistor gates.

3. The method of claim 1 wherein said step (a) comprises providing a polished substrate with metal lines and vias therein.

4. The method of claim 1 wherein said first dielectric layer comprises silicon nitride.

5. The method of claim 1 wherein said second dielectric layer comprises an interlayer dielectric oxide.

6. The method of claim 1 wherein polishing said substrate further comprises applying a chemical-mechanical polishing process.

7. The method of claim 1 wherein etching and removing said first dielectric layer comprises wet etching with hot phosphoric acid.

8. The method of claim 1 wherein depositing metal further comprises depositing a barrier liner and seed layer for metal deposition, and depositing copper metal.

9. The method of claim 8 further comprising polishing said copper metal.

10. A method for implementing low dielectric lines between metal lines in a damascene scheme, comprising the steps of:

a) providing a substrate having a substrate top surface;

b) polishing said substrate top surface;

c) depositing a silicon nitride layer on said substrate top surface;

d) forming silicon nitride lines, said nitride lines having exposed top surfaces;

e) depositing an oxide layer having an upper surface and forming air gaps therein such that said air gaps are located in the spaces between said nitride lines and below said nitride lines top surfaces;

f) polishing said oxide layer and exposing the top surface of said nitride lines;

g) removing said nitride lines such that oxide lines having air gaps therein remain on said substrate;

h) depositing a metal layer between said oxide lines; and, i) polishing said metal layer to expose the upper surface of said oxide lines.

11. The method of claim 10 wherein said substrate further comprises a plurality of metal lines with connecting vias.

12. The method of claim 10 wherein said step (a) further includes providing said substrate having a dielectric layer on said top surface with vias connecting to transistor gates.

13. The method of claim 10 wherein said step (b) comprises polishing said top surface using a chemical-mechanical polishing process.

14. The method of claim 10 wherein said step (c) comprises depositing a silicon nitride layer using a plasma chemical vapor deposition process.

15. The method of claim 10 wherein said step (c) further comprises depositing a silicon nitride layer at a predetermined height.

16. The method of claim 15 wherein said step (c) said predetermined height is determined to be equal to or greater than the thickness of metal lines to be later deposited.

17. The method of claim 10 wherein said step (d) comprises forming said lines by patterning and etching said nitride layer in accordance with predetermined metal design rules.

18. The method of claim 17 wherein said step (d) comprises forming said lines in a predetermined line-space geometry.

19. The method of claim 10 wherein said step (e) comprises depositing an interlayer dielectric oxide layer.

20. The method of claim 10 wherein said step (g) comprises removing said nitride lines using a wet etch process.

21. The method of claim 20 wherein said wet etch process comprises using a hot phosphoric acid.

22. The method of claim 20 wherein said step (g) further comprises performing a post etch clean.

23. The method of claim 10 wherein said step (h) further comprises:

a) depositing a barrier liner between said oxide lines; and, b) depositing a metal seed layer between said oxide lines.

24. The method of claim 23 wherein said barrier liner comprises tantalum nitride.

25. The method of claim 24 wherein said metal seed layer comprises a copper seed layer.

26. The method of claim 10 wherein said step (h) said metal layer includes one of the following metals: copper or aluminum.

27. The method of claim 10 further comprising the steps of:

j) depositing a thin film silicon nitride layer;

k) depositing a second oxide layer on said thin film silicon nitride layer;

l) patterning and etching said oxide layer for placement of vias; and, m) depositing metal for said vias.

* * * * *